US007913748B2

(12) United States Patent
Lin et al.

(10) Patent No.: US 7,913,748 B2
(45) Date of Patent: Mar. 29, 2011

(54) VAPOR CHAMBER

(75) Inventors: Kuo-Len Lin, Wugu Township, Taipei County (TW); Wen-Jung Liu, Wugu Township, Taipei County (TW); Chen-Hsiang Lin, Wugu Township, Taipei County (TW); Chih-Hung Cheng, Wugu Township, Taipei County (TW); Ju-Tsu Huang, Wugu Township, Taipei County (TW)

(73) Assignees: Golden Sun News Techniques Co., Ltd., Taipei County (TW); CPUMATE Inc., Taipei County (TW)

( * ) Notice: Subject to any disclaimer, the term of this patent is extended or adjusted under 35 U.S.C. 154(b) by 302 days.

(21) Appl. No.: 12/128,127

(22) Filed: May 28, 2008

(65) Prior Publication Data
US 2009/0294104 A1    Dec. 3, 2009

(51) Int. Cl.
*F28D 15/00*    (2006.01)
(52) U.S. Cl. ............... 165/104.26; 165/80.4; 361/700
(58) Field of Classification Search ........... 165/104.26, 165/104.33, 80.4; 361/700, 704
See application file for complete search history.

(56) References Cited

U.S. PATENT DOCUMENTS

| | | | | |
|---|---|---|---|---|
| 3,681,843 A * | 8/1972 | Arcella et al. | ............... | 29/423 |
| 4,108,239 A * | 8/1978 | Fries | ..................... | 165/104.26 |
| 5,076,352 A * | 12/1991 | Rosenfeld et al. | ....... | 165/104.26 |
| 6,460,612 B1 * | 10/2002 | Sehmbey et al. | ............... | 165/96 |
| 6,650,544 B1 * | 11/2003 | Lai | ................................ | 361/700 |
| 6,871,701 B2 * | 3/2005 | Ueki et al. | ............... | 165/104.26 |
| 7,431,071 B2 * | 10/2008 | Wenger | ..................... | 165/104.33 |
| 7,543,629 B2 * | 6/2009 | Chin et al. | ............... | 165/104.26 |
| 7,677,299 B2 * | 3/2010 | Zheng | ..................... | 165/104.26 |
| 2003/0051859 A1 * | 3/2003 | Chesser et al. | ........... | 165/104.26 |
| 2004/0040696 A1 * | 3/2004 | Cho et al. | ................. | 165/104.26 |
| 2006/0162906 A1 * | 7/2006 | Hong et al. | ............... | 165/104.26 |
| 2006/0162907 A1 * | 7/2006 | Wu et al. | ................. | 165/104.26 |
| 2006/0169439 A1 * | 8/2006 | Hong et al. | ............... | 165/104.26 |
| 2006/0213646 A1 * | 9/2006 | Hsu | ........................... | 165/104.26 |
| 2006/0260786 A1 * | 11/2006 | Hsu | ........................... | 165/104.26 |
| 2007/0187072 A1 * | 8/2007 | Chin et al. | ............... | 165/104.26 |
| 2007/0246194 A1 * | 10/2007 | Hou et al. | ................. | 165/104.26 |
| 2007/0261243 A1 * | 11/2007 | Yang et al. | ................. | 29/890.03 |

* cited by examiner

*Primary Examiner* — Ljiljana (Lil) V Ciric
(74) *Attorney, Agent, or Firm* — Chun-Ming Shih; HDLS IPR Services

(57) ABSTRACT

A vapor chamber includes a plate and a wick structure. The plate is provided therein with a working fluid, and the plate has a heated end and a condensed end. The wick structure includes a first wick portion adhered to be opposite to the heated end, a second wick portion overlapping on the first wick portion, and a third wick portion adhered on the rest portion of a chamber. The aperture diameter of the first wick portion is larger than that of the second wick portion, or the aperture density of the first wick portion is smaller than that of the second wick portion. The amount of working fluid attached to the second wick portion is smaller than that of the first wick portion. After heating, the working fluid attached to the second wick portion is vaporized more quickly.

16 Claims, 3 Drawing Sheets

VAPOR CHAMBER

BACKGROUND OF THE INVENTION

1. Field of the Invention

The present invention relates to a heat exchanger, and in particular to a vapor chamber in which a wick structure and a working fluid are provided.

2. Description of Prior Art

A vapor chamber is a kind of plate-like heat pipes. The principle of the vapor chamber is the same as that of the heat pipe. Via an internal vacuum environment, a working fluid filled therein can generate phase change when heated, so that the heat can be transferred by vapors. Then, the working fluid returns to its liquid state after being cooled, so that the working fluid can be circulated in the vapor chamber.

However, the manufacturing process of the vapor chamber is different from that of the heat pipe. The pipe body of the heat pipe is usually formed into a tubular body. After sealing one end of the pipe body, at the open end of the heat pipe, some processes are performed, such as the filling of working fluid, degassing or vacuum-pumping process. When the degassing process is finished, the pipe body is sealed immediately, thereby completing the manufacturing of the heat pipe. However, the plate body of the vapor chamber is constituted of two plates that are covered with each other vertically. Thus, the completely-manufactured vapor chamber is formed into a plate rather than a pipe. Furthermore, the two surfaces of the vapor chamber that have larger surface areas are used as a heated end and a condensed end respectively. Therefore, in operation, the vapor chamber lies horizontally, so that the heat is absorbed by the wick structure on the inner wall of the vapor chamber and is accumulated in the inner bottom thereof. Furthermore, the vapor chamber is adhered to a heat-generating source with a central portion of the heated end. However, the wick structures on the heated end and the condensed end cannot make the working fluid to be vaporized quickly, which affects the efficiency of heat transfer.

In view of the above drawbacks, the Inventor proposes the present invention based on his expert knowledge and elaborate researches in order to solve the problems of prior art.

SUMMARY OF THE INVENTION

The present invention is to provide a vapor chamber, in which the wick structure on the heated end of the vapor chamber is made by means of overlapping two wick portions of different aperture diameters or densities. Furthermore, the aperture diameter of the wick portion adhered on the inner wall surface is larger that of the overlapping wick portion. Alternatively, the aperture density of the wick portion adhered on the inner wall surface is lower than that of the overlapping wick portion. Therefore, since the aperture diameter is smaller or the density is larger, the working fluid flowing therein will be dispersed more easily. The amount of dispersed working fluid is thus smaller, so that it can be vaporized faster after heated. As a result, the time for vaporizing the working fluid at an earlier stage can be reduced, thereby transmitting the heat more quickly.

The present invention is to provide a vapor chamber, in which the diameter of the remaining apertures is larger than the above two aperture diameters, or the density is smaller than the above two densities. In this way, since the aperture diameter is larger or the aperture density is smaller, the working fluid flowing therein can be accumulated more easily, and thus a large amount of working fluid returning to its liquid state can flow back. Therefore, a amount of working fluid to be vaporized can be stored, thereby preventing the vapor chamber from getting empty.

The present invention is to provide a vapor chamber, which includes a plate having a chamber and a wick structure adhered to inner wall surfaces of the chamber. The plate is provided therein with a working fluid. One surface of the plate is used as a heated end, and the other opposite surface of the plate is used as a condensed end. The wick structure comprises a first wick portion adhered to the plate opposite to the heated end, a second wick portion overlapping on the first wick portion, and a third wick portion adhered on the remaining inner wall surfaces of the chamber. The third wick portion opposite to the condensed end is separated from the second wick portion by the chamber. The aperture diameter of the first wick portion is larger than that of the second wick portion, or the aperture density of the first wick portion is smaller than that of the second wick portion.

Furthermore, the present invention is to provide a vapor chamber, in which the aperture diameter of the first wick portion is smaller than that of the third wick portion, or the aperture density of the first wick portion is larger than that of the third wick portion.

DETAILED DESCRIPTION OF THE INVENTION

In order to make the Examiner to better understand the characteristics and technical contents of the present invention, a detailed description relating thereto will be made with reference to the accompanying drawings. However, the drawings are illustrative only, but not used to limit the present invention.

Figure 1:
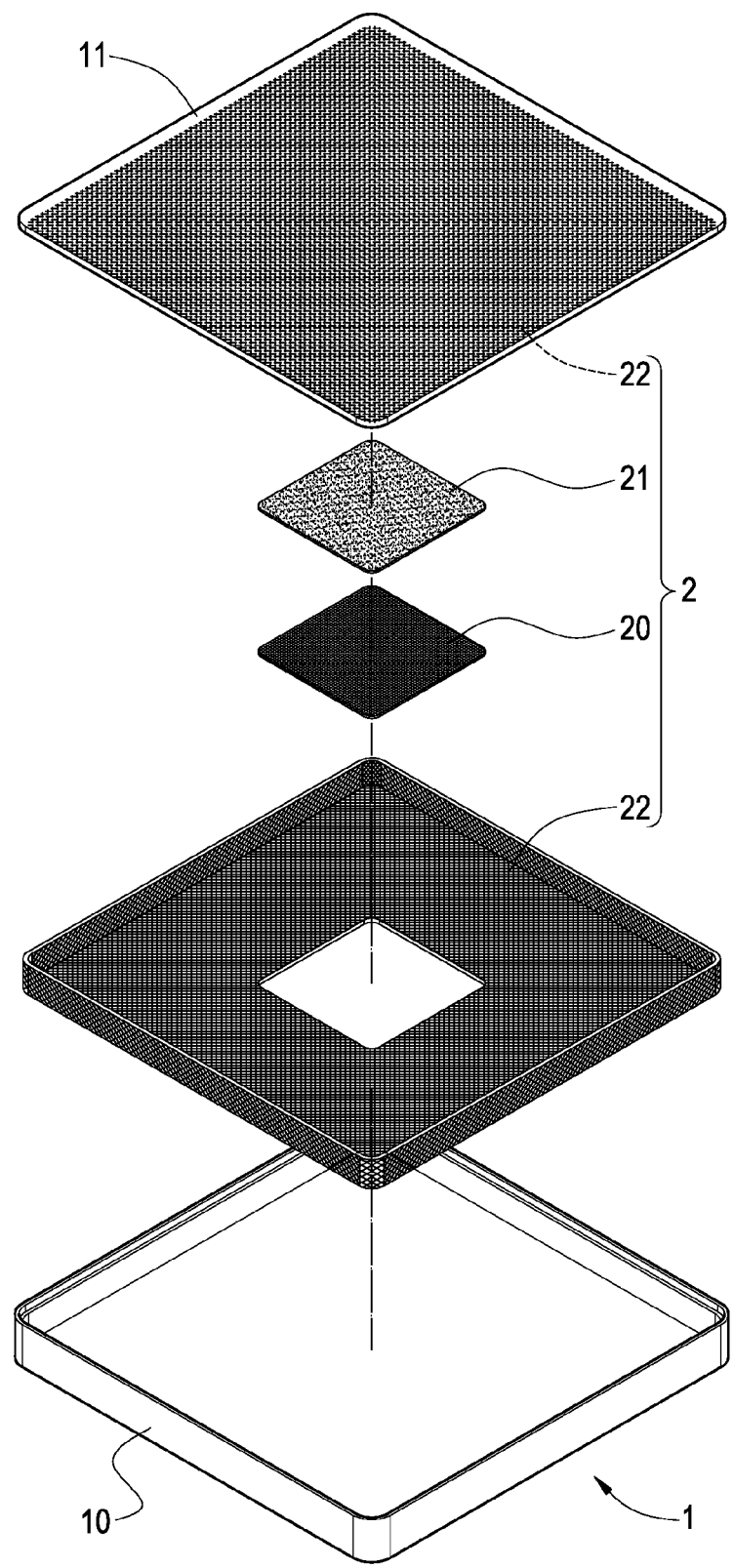
FIG. 1 is an exploded perspective view of the present invention.
Figure 2:
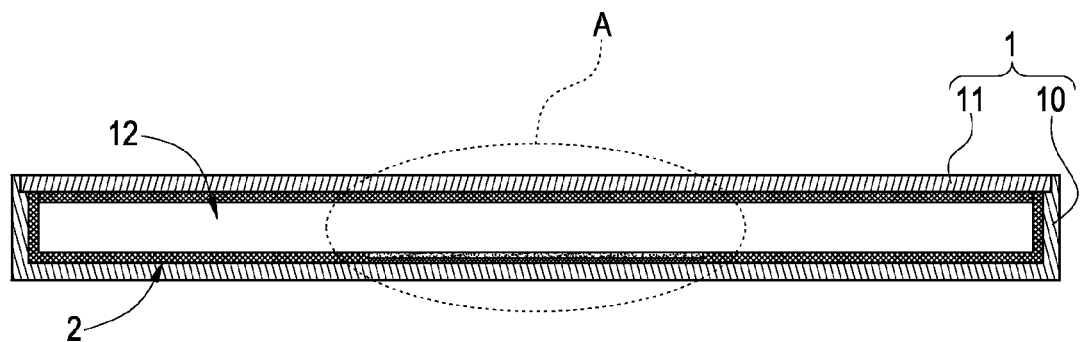
FIG. 2 is a cross-sectional view showing the assembly of the present invention.

Please refer to FIGS. 1 and 2, which are an exploded perspective view and an assembled cross-sectional view of the present invention, respectively. The present invention is to provide a vapor chamber, which includes a plate 1 and a wick structure 2 adhered to each inner wall surface of the plate.

The interior of the plate 1 is hollowed and it is made of heat-dissipating materials. The plate 1 is constituted of a base 10 and a top cover 11. After the base 10 and the top cover 11 are connected with each other, the hollow space within the plate 1 forms a chamber 12. The chamber 12 is sealed and filled with a working fluid (not shown) therein. In addition, the plate 1 has two surfaces of larger surface areas. That is, the lower surface of the base 10 and the upper surface of the top cover 11 are used to as a heated end and a condensed end of the vapor chamber respectively.

Figure 3:
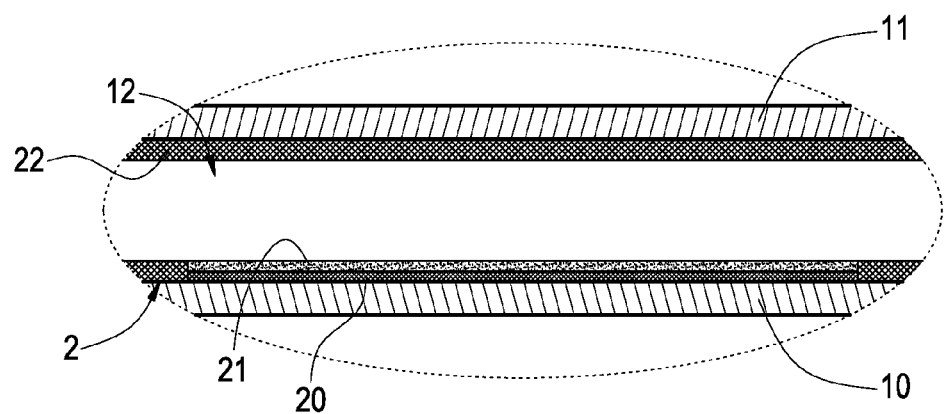
FIG. 3 is a partial view showing the details of portion A in FIG. 2.

The wick structure 2 is adhered on the inner wall surfaces of the chamber 12 of the plate 1, and is constituted of a first wick portion 20, a second wick portion 21 and a third wick portion 22. The first wick portion 20 is adhered on the inner wall surface of the plate 1 opposite to the heated end. The second wick portion 21 overlaps on the first wick portion 20 (also refer to FIG. 3). The rest of the wick structure is the third wick portion 22. That is to say, expect for the inner wall surface of the plate opposite to the heated end, the rest of the wick portion adhered to the inner wall surfaces of the chamber 12 belongs to the third wick portion 22. At the same time, with respect to the condensed end of the plate, the third wick portion 21 is separated from the second wick portion 21 by the chamber 12. That is to say, the second wick portion 21 is separated from the third wick portion 22 on the inner wall surface of the top cover 11 by the chamber 12. The second wick portion and the third wick portion face to each other without contacting, as shown in FIG. 3.

According to the present invention, the first, second and third wick portions 20, 21, 22 are different from one another in aperture diameter and density. The aperture diameter means the diameter of apertures formed in the wick structure. The wick structure can be made by means of sintering woven meshes or powder. Therefore, when the woven meshes are loosely distributed or the size of the sintered powder is large, the thus-formed meshes are smaller (i.e. the aperture diameter is smaller). On the other hand, when the woven meshes are distributed densely, or the particle size of sintered powder is smaller, the thus-formed meshes are smaller and the aperture diameter is smaller. Furthermore, the aperture density means the degree of distribution under the same area or volume. Since the smaller the aperture diameter is, the more the apertures are distributed. Therefore, if the apertures are distributed more densely, the aperture density is larger. Conversely, the larger the aperture diameter is, the less the apertures are distributed. Thus, if the apertures are distributed more loosely, the aperture density is smaller.

Therefore, in terms of the aperture diameter, the second wick portion 21 is the smallest, the first wick portion 20 is larger and the third wick portion 22 is the largest. On the other hand, in terms of the aperture density, the second wick portion 21 is the largest, the first wick portion 20 is smaller and the third wick portion 22 is the smallest. With different aperture diameters or aperture densities, each portion of the wick structure 3 can exhibit desired better properties of the vapor chamber. For example, if the vaporization is to be performed more quickly, the aperture diameter should be small and the density should be large, so that the working fluid flowing therein can be dispersed more easily and thus can be vaporized more quickly. If a larger amount of working fluid is to be stored, the aperture density should be large and the density should be small. This will be further described later.

Therefore, with the above constituents, the vapor chamber of the present invention can be achieved.

Figure 4:
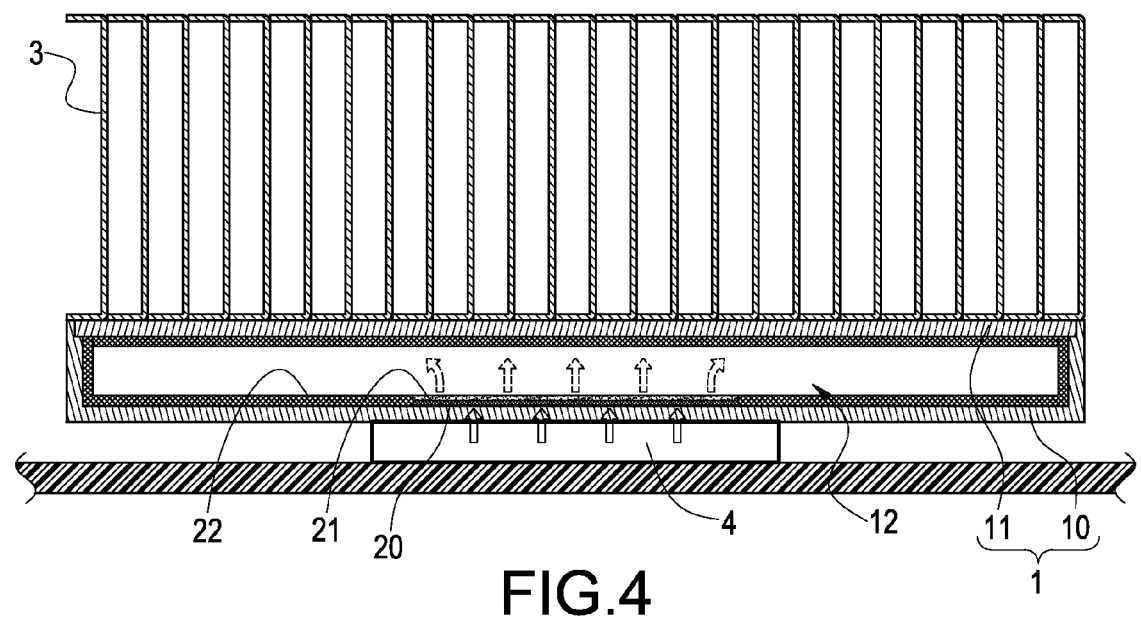
FIG. 4 is a schematic view showing the operating state of the present invention.

According to the above, as shown in FIG. 4, the condensed end of the vapor chamber is further provided with a plurality of heat-dissipating fins 3, so that it can be used to dissipate the heat of an electronic heat source 4. The heated end of the vapor chamber is adhered to the surface of the heat source 4. Before the heat source 4 generates heat, the working fluid within the vapor chamber is in liquid state and accumulated in the chamber 12. Therefore, the working fluid is located in the first and second wick portions 20, 21 and a portion of the third wick portion near the heated end.

According to the above, when the heat source 4 generates heat, the heated end of the vapor chamber is heated and absorbs the generated heat. Since the second wick portion 21 has smaller aperture diameter (or larger aperture density) than the first wick portion 20, the working fluid flowing in the second wick portion 21 can be dispersed more easily. Since the amount of dispersed working fluid is less, the working fluid in the second wick portion 21 will be vaporized more quickly than that in the first wick portion 20. Thus, via the vapor, partial heat of the heat source 4 can be transmitted toward the condensed end of the vapor chamber through the chamber 12, thereby reducing the time for vaporizing the working fluid at earlier stage. Thus, the object of transmitting heat quickly can be achieved. After the vaporized working fluid is cooled by the condensed end, the working fluid returning to liquid state will flow back to the first and second wick portions 20, 21 on the heated end quickly. At this time, since the third wick portion 22 is larger in aperture diameter (or lower in aperture density) than the first wick portion 20, the working fluid flowing therein can be accumulated more easily, thereby allowing a large amount of liquid working fluid to flow back and storing a amount of working fluid to be vaporized. As a result, the vapor chamber can be avoided from getting empty.

According to the above, the present invention really achieves the desired objects and solves the drawbacks of prior art. Further, the present invention indeed has novelty and inventive steps, and thus conforms to the requirements for an invention patent.

Although the present invention has been described with reference to the foregoing preferred embodiments, it will be understood that the invention is not limited to the details thereof. Various equivalent variations and modifications can still occur to those skilled in this art in view of the teachings of the present invention. Thus, all such variations and equivalent modifications are also embraced within the scope of the invention as defined in the appended claims.

What is claimed is:

1. A vapor chamber, comprising:
   a plate with an interior hollowed and having a chamber, the chamber being provided therein with working fluid, one surface of the plate being used as a heated end, the other opposite surface of the plate being used as a condensed end; and
   a wick structure adhered on inner wall surfaces of the chamber and comprising a first wick portion adhered to the plate opposite to the heated end, a second wick portion overlapping the entire first wick portion, and a third wick portion adhered on remaining inner wall surfaces of the chamber and not overlapping either the first wick portion or the second wick portion, the third wick portion being opposite to the condensed end being separated from the second wick portion by the chamber;
   wherein an aperture diameter of the first wick portion is larger than that of the second wick portion.

2. The vapor chamber according to claim 1, wherein the plate includes a base and a top cover, and the base and the top cover are connected to each other to form the chamber.

3. The vapor chamber according to claim 2, wherein a lower surface of the base is the heated end, and an upper surface of the top cover is the condensed end.

4. The vapor chamber according to claim 1, wherein the first and second wick portions are woven meshes, and the first wick portion is more loosely than the second wick portion.

5. The vapor chamber according to claim 1, wherein the first and second wick portions are made of sintering powder, and a powder size of the first wick portion is larger than that of the second wick portion.

6. The vapor chamber according to claim 1, wherein the aperture diameter of the first wick portion is smaller than that of the third wick portion.

7. The vapor chamber according to claim 6, wherein the first and third wick portions are woven meshes, and the first wick portion is more densely than the third wick portion.

8. The vapor chamber according to claim 6, wherein the first and third wick portions are made of sintering powder, and a particle size of the first wick portion is smaller than that of the third wick portion.

9. A vapor chamber, comprising:

a plate with an interior hollowed and having a chamber, the chamber being provided therein with working fluid, one surface of the plate being used as a heated end, the other opposite surface of the plate being used as a condensed end; and a wick structure adhered on inner wall surfaces of the chamber and comprising a first wick portion adhered to the plate opposite to the heated end, a second wick portion overlapping the entire first wick portion, and a third wick portion adhered on remaining inner wall surfaces of the chamber and not overlapping either the first wick portion or the second wick portion, the third wick portion being opposite to the condensed end being separated from the second wick portion by the chamber;

wherein an aperture density of the first wick portion is smaller than that of the second wick portion.

10. The vapor chamber according to claim 9, wherein the plate includes a base and a top cover, and the base and the top cover are connected to each other to form the chamber.

11. The vapor chamber according to claim 10, wherein a lower surface of the base is the heated end, and a upper surface of the top cover is the condensed end.

12. The vapor chamber according to claim 9, wherein the first and second wick portions are woven meshes, and the first wick portion is more loosely than the second wick portion.

13. The vapor chamber according to claim 9, wherein the first and second wick portions are made of sintering powder, and a powder size of the first wick portion is larger than that of the second wick portion.

14. The vapor chamber according to claim 9, wherein the aperture density of the first wick portion is larger than that of the third wick portion.

15. The vapor chamber according to claim 14, wherein the first and third wick portions are woven meshes, and the first wick portion is more densely than the third wick portion.

16. The vapor chamber according to claim 14, wherein the first and third wick portions are made of sintering powder, and a particle size of the first wick portion is smaller than that of the third wick portion.

* * * * *